(12) United States Patent
Kim (10) Patent No.: US 12,120,922 B2
(45) Date of Patent: Oct. 15, 2024

(54) DISPLAY WITH LIGHT ABSORBER ROUND OPTICAL ELEMENT

(71) Applicant: LG Display Co., Ltd., Seoul (KR)

(72) Inventor: Choonghyo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 345 days.

(21) Appl. No.: 17/122,586

(22) Filed: Dec. 15, 2020

(65) Prior Publication Data

US 2021/0202627 A1 Jul. 1, 2021

(30) Foreign Application Priority Data

Dec. 31, 2019 (KR) .................. 10-2019-0179601

(51) Int. Cl.
*H01L 27/32* (2006.01)
*H01L 51/52* (2006.01)
*H10K 50/856* (2023.01)
*H10K 59/122* (2023.01)
*H10K 59/65* (2023.01)

(52) U.S. Cl.
CPC ......... *H10K 59/122* (2023.02); *H10K 50/856* (2023.02); *H10K 59/65* (2023.02)

(58) Field of Classification Search
CPC .................................................. H10K 59/122
See application file for complete search history.

(56) References Cited

U.S. PATENT DOCUMENTS

| | | | |
|---|---|---|---|
| 2012/0206669 A1* | 8/2012 | Kim | G02F 1/133308 349/153 |
| 2017/0186823 A1 | 6/2017 | Kim et al. | |
| 2018/0033835 A1 | 2/2018 | Zeng et al. | |
| 2019/0158713 A1* | 5/2019 | Mcmillan | H04N 23/90 |
| 2019/0310724 A1* | 10/2019 | Yeke Yazdandoost | H10K 59/121 |
| 2020/0064681 A1* | 2/2020 | Son | G02F 1/133308 |
| 2020/0373519 A1* | 11/2020 | Wang | H10K 50/852 |
| 2021/0066648 A1* | 3/2021 | Chung | H10K 50/86 |

(Continued)

FOREIGN PATENT DOCUMENTS

| | | | | |
|---|---|---|---|---|
| CN | 108919545 A | * | 11/2018 | ....... G02F 1/133512 |
| CN | 110021642 A | | 7/2019 | |

(Continued)

OTHER PUBLICATIONS

Office Action issued Nov. 11, 2023 for corresponding Chinese Patent Application No. 202011536194.9 Citation: CN 108919545 A is of record.

(Continued)

*Primary Examiner* — Peter Bradford (74) *Attorney, Agent, or Firm* — Morgan, Lewis & Bockius LLP (57) ABSTRACT

A display apparatus is disclosed, which includes a display panel having a first area and a second area, a main body supporting the display panel, an auxiliary member arranged in the main body and overlapped with the first area of the display panel, and a light absorption portion arranged in the second area of the display panel to surround the first area of the display panel. Therefore, external light reflected from the auxiliary member is prevented from being re-reflected in the auxiliary member, whereby image overlap or noise may be prevented from occurring.

17 Claims, 8 Drawing Sheets

(56) References Cited

U.S. PATENT DOCUMENTS

2021/0176872 A1* 6/2021 Woo ................. H10K 59/60
2021/0333466 A1* 10/2021 Zhou ................ G02B 6/0055
2021/0359246 A1   11/2021 Sun
2021/0408146 A1   12/2021 Ying et al.
2021/0408499 A1* 12/2021 Li .................... H04N 23/57

FOREIGN PATENT DOCUMENTS

| CN | 110265455 A | 9/2019 |
| CN | 110444570 A | 11/2019 |
| CN | 110473898 A | 11/2019 |
| KR | 10-2017-0014043 A | 2/2017 |
| KR | 10-2017-0077887 A | 7/2017 |
| KR | 10-2019-0056670 A | 5/2019 |

OTHER PUBLICATIONS

Office Action issued in corresponding Korean Patent Application No. 10-2019-0179601, dated Jun. 5, 2024. (Note: CN 108919545 A was previously cited).

* cited by examiner

DISPLAY WITH LIGHT ABSORBER ROUND OPTICAL ELEMENT

This application claims the benefit of Korean Application No. 10-2019-0179601, filed Dec. 31, 2019, which is hereby incorporated by reference.

BACKGROUND

Technical Field

The present disclosure relates to a display apparatus outputting an image.

Discussion of the Related Art

Recently, with the advancement of the information age, a display field for processing and displaying mass information has been rapidly developed. In response to this trend, various flat panel display apparatuses have been developed and spotlighted.

Since the flat panel display apparatus uses a glass substrate to resist high heat generated during a manufacturing process, there is limitation in lightweight and thin profile and flexibility. Therefore, a flexible display apparatus manufactured using a flexible material such as plastic instead of a glass substrate having no flexibility to maintain display performance even though it is bent like a paper has emerged as an advanced flat panel display apparatus.

Meanwhile, studies for embodying a front surface portion on which an image is output, as a full screen display have been actively ongoing in recent years. The full screen display means an image apparatus in which a front surface portion is embodied as a full screen without a hole by arranging additional devices such as a camera, an illumination sensor and a proximity sensor, which are used to be arranged to be protruded on the front surface portion, inside a main body (or below a display).

Since the additional devices may be arranged inside the main body (or below a display), the full screen display has no elements protruded outside the display, whereby a satisfaction may be given to a user in view of design. Also, since a hole does not need to be provided in the display arranged on a front surface portion, a manufacturing process may be simplified.

However, the full screen display has a problem as follows. Since an additional device, for example, a camera is arranged inside the main body (or below the display), external light entering toward the camera is reflected from a surface and the inside of the camera and then re-reflected in a metal material such as an electrode or line arranged inside the main body (or below the display), whereby external light directly entering toward the camera from the outside and external light re-reflected from the inside of the main body (or below the display) reach the camera. As a result, image overlap or noise may occur.

SUMMARY

Accordingly, embodiments of the present disclosure are directed to a display apparatus that substantially obviates one or more of the problems due to limitations and disadvantages of the related art.

An aspect of the present disclosure is to provide a display apparatus that may prevent image overlap or occurrence of noise due to reflection of external light inside a main body (or below a display).

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display apparatus comprises a display panel having a first area and a second area, a main body supporting the display panel, an auxiliary member arranged in the main body and overlapped with the first area of the display panel, and a light absorption portion arranged in the second area of the display panel to surround the first area of the display panel.

In the display apparatus according to the present disclosure, as the light absorption portion arranged in the second area of the display panel is provided to surround the first area of the display panel, external light reflected from the auxiliary member is prevented from being re-reflected in the auxiliary member, whereby image overlap or noise may be prevented from occurring.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display apparatus according to the present disclosure will be described in detail with reference to the accompanying drawings. Wherever possible, the same reference numbers will be used throughout the drawings to refer to the same or like parts.

Figure 1:
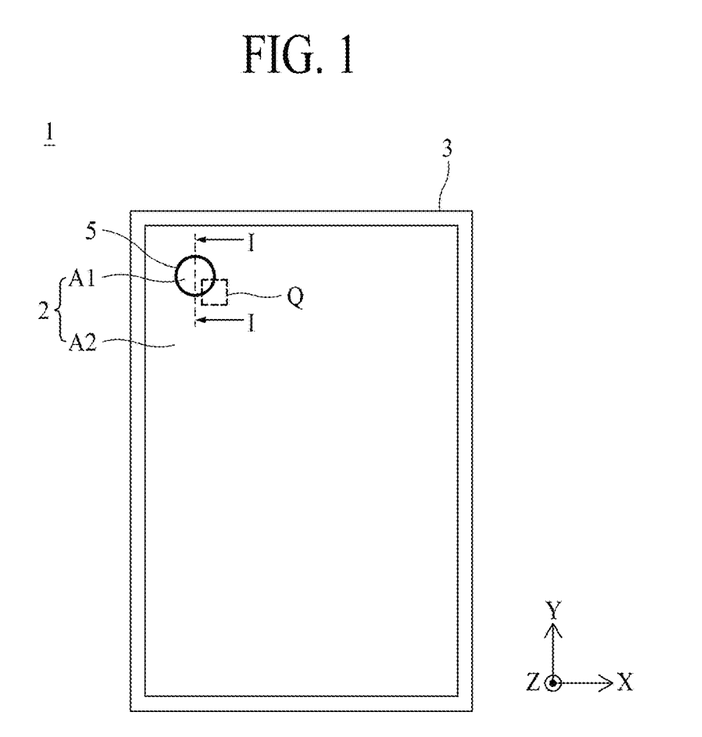
FIG. 1 is a brief plane view illustrating a display apparatus according to one embodiment of the present disclosure.
Figure 2A:
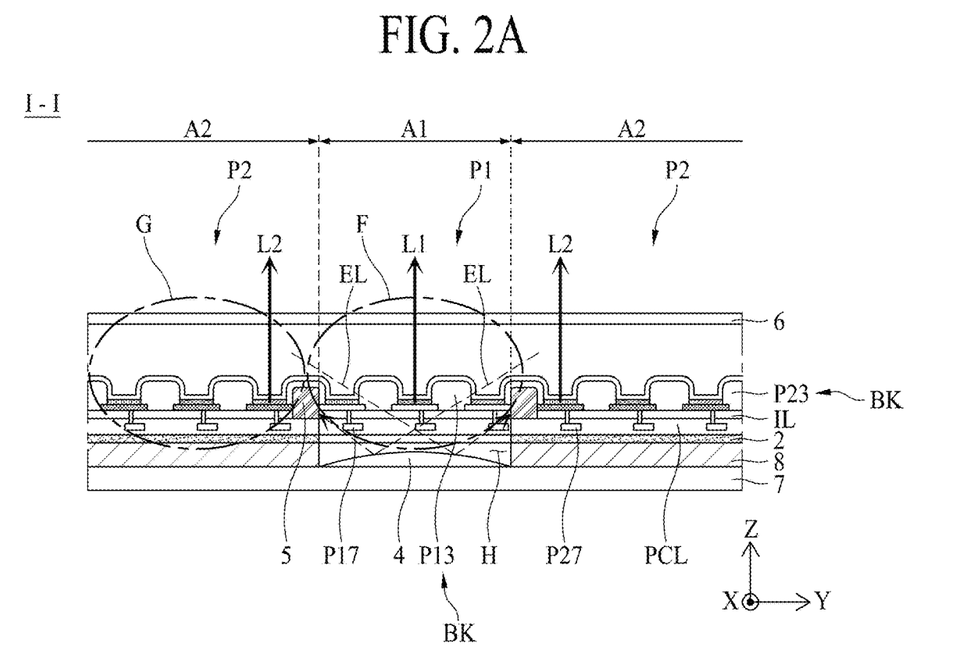
FIG. 2A is a brief cross-sectional view taken along line I-I shown in FIG. 1.
Figure 2B:
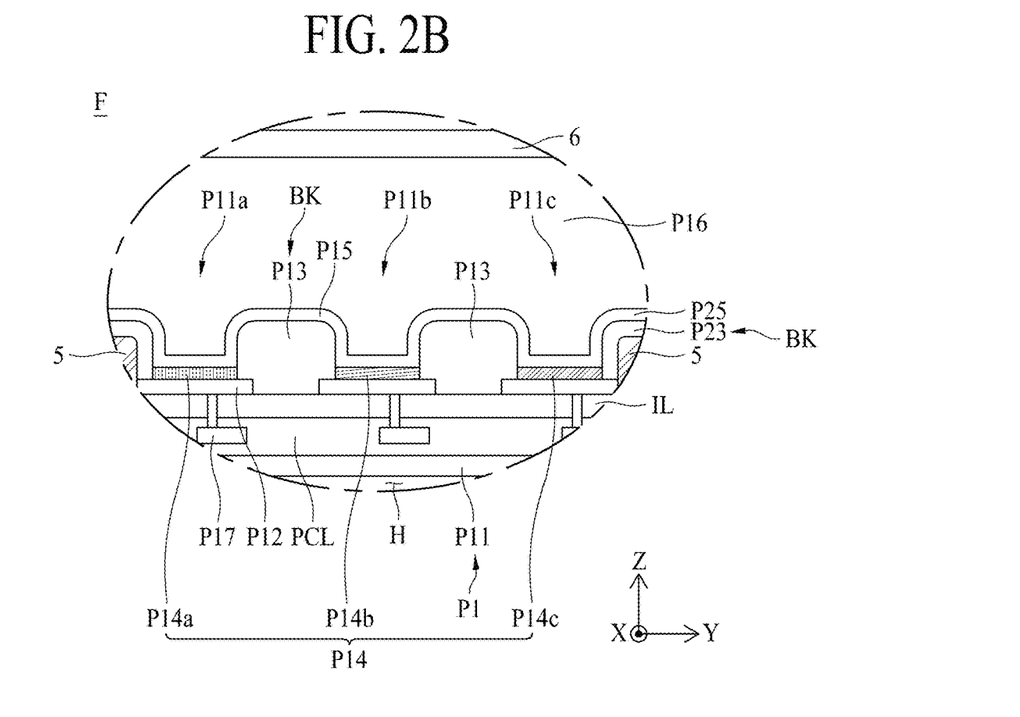
FIG. 2B is a brief enlarged view illustrating a portion F of FIG. 2A.
Figure 2C:
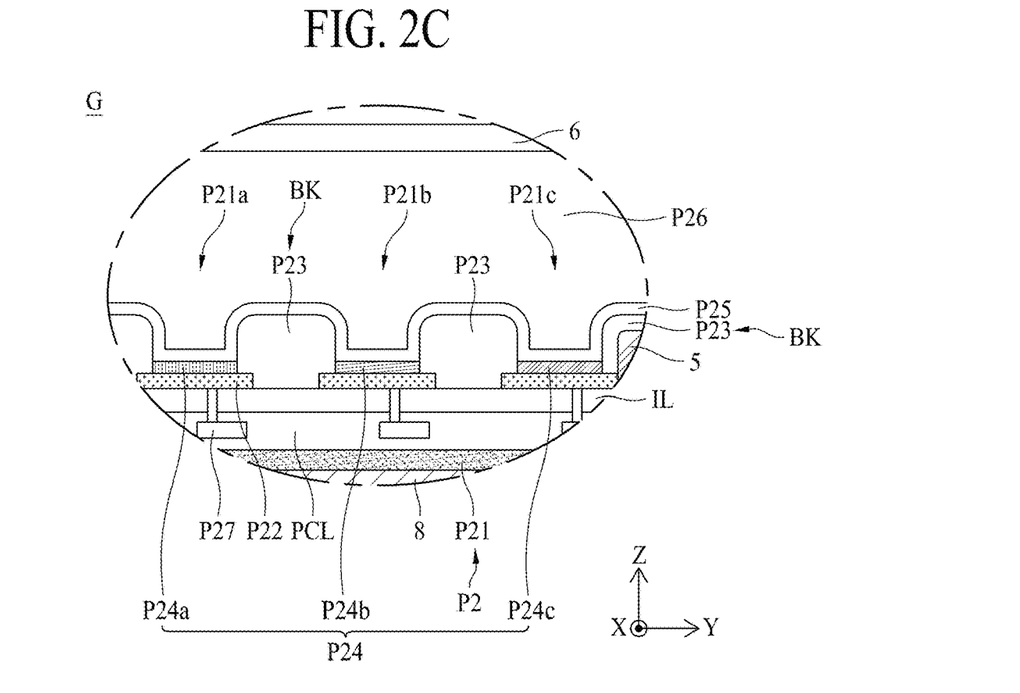
FIG. 2C is a brief enlarged view illustrating a portion G of FIG. 2A.
Figure 3:
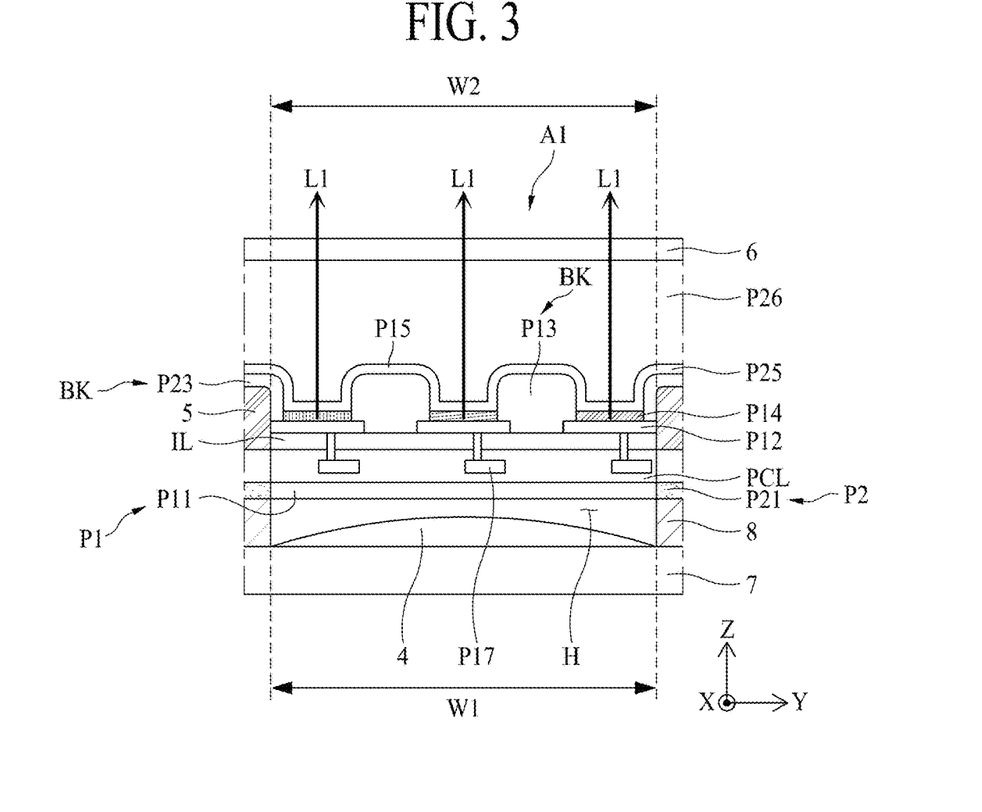
FIG. 3 is a brief view illustrating a first area of FIG. 2A.
Figure 4:
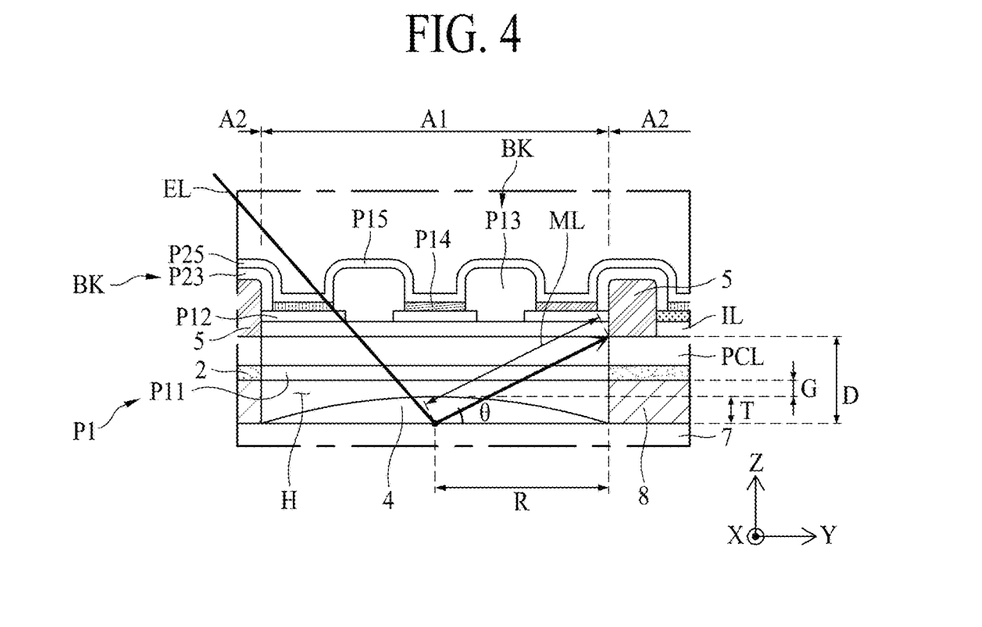
FIG. 4 is a brief view illustrating a spaced interval between an auxiliary member and a substrate of FIG. 2A.

FIG. 1 is a brief plane view illustrating a display apparatus according to one embodiment of the present disclosure, FIG. 2A is a brief cross-sectional view taken along line I-I shown in FIG. 1, FIG. 2B is a brief enlarged view illustrating a portion F of FIG. 2A, FIG. 2C is a brief enlarged view illustrating a portion G of FIG. 2A, FIG. 3 is a brief view illustrating a first area of FIG. 2A, and FIG. 4 is a brief view illustrating a spaced interval between an auxiliary member and a substrate of FIG. 2A.

Referring to FIGS. 1 to 4, the display apparatus 1 according to one embodiment of the present disclosure comprises a display panel 2, a main body 3, an auxiliary member 4, and a light absorption portion 5. The display panel 2 includes a first area A1 and a second area A2. The auxiliary member 4 may be arranged inside the main body 3 (or below the display panel 2). The light absorption portion 5 may be arranged in the second area A2 of the display panel 2 to surround the first area A1 of the display panel 2.

The first area A1 according to one example may be provided as a transparent area, and the second area A2 according to one example may be provided as an opaque area. Since the auxiliary member 4 such as a camera, an illumination sensor and a proximity sensor is arranged at a lower portion of the first area A1, the first area A1 may be provided as a transparent area such that external light EL (shown in FIG. 2A) may reach the auxiliary member 4. On the other hand, since the auxiliary member 4 is not arranged in the second area A2, the second area A2 may be provided as an opaque area.

The first area A1 and the second area A2 may emit light toward a user located outside the display panel 2. In more detail, first image light L1 (shown in FIG. 2A) emitted from the first area A1 and second image light L2 (shown in FIG. 2A) emitted from the second area A2 may be emitted toward the user.

The present disclosure will be described based on that a user (not shown) is located outside in Z axis direction (shown in FIG. 2A) from the display panel 2. The Z axis direction may mean a thickness direction of the display apparatus 1 according to one embodiment of the present disclosure. X axis direction (shown in FIG. 1) is a direction vertical to the Z axis direction, and may mean a horizontal length (or width) of the display apparatus 1 according to one embodiment of the present disclosure. Y axis direction (shown in FIG. 1) is a direction vertical to each of the Z axis direction and the X axis direction, and may mean a vertical length of the display apparatus 1 according to one embodiment of the present disclosure.

The display panel 2 may be a display apparatus emitting image light. The image light may be mixed light of the first image light L1 and the second image light L2. The display panel 2 may be a flexible display panel manufactured using a flexible material such as plastic to maintain display performance even though it is bent like a paper. The display panel 2 according to one example may be a rectangular plate shape on the whole but may be another shape.

The first area A1 of the display panel 2 is a partial area of the display panel 2 arranged to correspond to the auxiliary member 4, and may be provided transparently due to its double-sided emission characteristic. Therefore, light emitted from the first area A1 of the display panel 2 may be emitted to the outside and the inside of the main body 3, and the external light EL may enter the auxiliary member 4 through the first area A1.

The second area A2 of the display panel 2 is an area except the first area A1 from the display panel 2, and may be provided opaquely due to its single-sided emission characteristic. For example, the second area A2 of the display panel 2 may be provided in a top emission mode to emit the second image light L2 toward a user.

Referring to FIGS. 1 and 2A, the first area A1 of the display panel 2 may be provided to be smaller than the second area A2. This is because that the auxiliary member 4 is smaller than the main body 3.

Meanwhile, the first area A1 may be spaced apart from an edge of the display panel 2. In this case, as shown in FIG. 2A, the second area A2 may be arranged based on the first area A1. Although not shown, the first area A1 may be arranged at an edge of the display panel 2. In this case, the auxiliary member 4 may be arranged below the edge of the display panel 2.

The first area A1 and the second area A2 of the display panel 2 may be areas which are not covered by the main body 3. Therefore, a user may view an image output from the display panel 2 through the first area A1 and the second area A2 of the display panel 2. In FIG. 1, the main body 3 may partially be arranged in a bezel area.

Since the second area A2 is based on single-sided emission (or top emission), the second image light L2 may be emitted to a user. However, since the first area A1 is based on double-sided emission, the first image light L1 may partially be emitted to a user, and the other first image light L1 may be emitted to the light absorption portion 5. Therefore, luminance of the first image light L1 may be lower than that of the second image light L2.

However, in a general display apparatus, since an auxiliary member such as a camera is externally protruded without being arranged to be overlapped with the display panel, there is no element for outputting an image while being overlapped with the auxiliary member unlike the first area A1 of the display apparatus 1 of the present disclosure, or even though there is an area overlapped with the auxiliary member, the area is provided not to emit an image. Therefore, since the display apparatus 1 according to one embodiment of the present disclosure emits image light even from the first area A1 unlike the general display apparatus although luminance of the first image light L1 is lower than that of the second image light L2, the display apparatus 1 according to one embodiment of the present disclosure may be provided such that a user has no sense of difference between an image output from the first area A1 and an image output from the second area A2.

Meanwhile, the external light EL may enter the auxiliary member 4 through the first area A1 of the display panel 2. The external light EL entering the auxiliary member 4 through the first area A1 of the display panel 2 is reflected from a surface and the inside of the auxiliary member 4 and then re-reflected to a metal material such as an electrode or line arranged in the second area A2, whereby direct external light EL directly entering toward the auxiliary member from the outside and re-reflective external light re-reflected from the inside of the main body (or below the display) reach the auxiliary member 4. For this reason, images may be overlapped with each other or noise may be generated.

However, in the display apparatus 1 according to one embodiment of the present disclosure, the light absorption portion 5 is provided in the second area A2 to surround the first area A1 of the display panel 2, whereby the external light EL reflected from the surface and the inside of the auxiliary member 4 is absorbed by the light absorption portion 5 and therefore the direct external light EL may reach the auxiliary member 4. Therefore, the display apparatus 1 according to one embodiment of the present disclosure may reduce inexactness of the auxiliary member 4, which is caused by re-reflective external light.

The first area A1, as shown in FIG. 2A, may be arranged to correspond to the auxiliary member 4. This is to allow the external light to reach the auxiliary member 4 through the first area A1. Therefore, a position of the first area A1 arranged in the display panel 2 may be varied depending on where the auxiliary member 4 is arranged inside the main body 3.

The first area A1 may include a plurality of first pixels P1. The second area A2 may include a plurality of second pixels P2. In the display apparatus 1 according to one embodiment of the present disclosure, the first pixel P1 and the second pixel P2 may be provided at, but not limited to, the same size. The first pixel P1 and the second pixel P2 may be provided at their respective sizes different from each other depending on an external absorption rate of the auxiliary member 4 or implementation of high resolution.

The first pixel P1 may include a substrate P11, a circuit element layer PCL, an insulating layer IL, a first electrode P12, a first bank P13, an organic light emitting layer P14, a second electrode P15, an encapsulation layer P16, and a first thin film transistor P17.

The substrate P11 may be a semiconductor substrate such as plastic film or silicon. The substrate P11 may be made of a transparent material that may allow the external light EL to reach the auxiliary member 4.

A plurality of subpixels P may be provided on the substrate P11. The substrate P11 according to one example may include a first subpixel P11a (shown in FIG. 2B) emitting red light, a second subpixel P11b (shown in FIG. 2B) emitting green light, and a third subpixel P11c (shown in FIG. 2B) emitting blue light. The first subpixel P11a, the second subpixel P11b and the third subpixel P11c may be arranged on the substrate P11 to adjoin one another. Each of the first subpixel P11a, the second subpixel P11b and the third subpixel P11c may be provided to include a first electrode P12, an organic light emitting layer P14, and a second electrode P15.

The circuit element layer PCL may be arranged on an upper surface of the substrate P11. A circuit element comprising a plurality of thin film transistors P17, various types of signal lines and a capacitor may be provided per each of the subpixels in the circuit element layer PCL. The signal lines may include gate lines, data lines, power lines and reference lines, and the first thin film transistor P17 may include a switching thin film transistor, a driving thin film transistor, and a sensing thin film transistor. The subpixels are defined by an intersection structure of the gate lines and the data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line, and serves to supply the generated data current to the first electrode P12.

The sensing thin film transistor serves to sense a threshold voltage deviation of the driving thin film transistor, which is a cause of image quality degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

The first thin film transistor P17 may include a first sub thin film transistor, a second sub thin film transistor, and a third sub thin film transistor. The first sub thin film transistor, the second sub thin film transistor and the third sub thin film transistor are arranged for each of the subpixels P11a, P11b and P11c in the substrate P11. The first sub thin film transistor according to one example may be connected to a first sub electrode arranged on the first subpixel P11a to apply a driving voltage for emitting light of a color corresponding to the first subpixel P11a.

The second sub thin film transistor according to one example may be connected to a second sub electrode arranged on the second subpixel P11b to apply a driving voltage for emitting light of a color corresponding to the second subpixel P11b.

The third sub thin film transistor according to one example may be connected to a third sub electrode arranged on the third subpixel P11c to apply a driving voltage for emitting light of a color corresponding to the third subpixel P11c.

Each of the first subpixel P11a, the second subpixel P11b and the third subpixel P11c according to one example supplies a predetermined current to the organic light emitting layer in accordance with the data voltage of the data line when a gate signal from the gate line is input thereto using each of the sub thin film transistors. For this reason, the organic light emitting layer of each of the first subpixel P11a, the second subpixel P11b and the third subpixel P11c may emit light with a predetermined brightness in accordance with the predetermined current.

The insulating layer IL may be arranged on an upper surface of the circuit element layer PCL. The insulating layer IL may planarize the upper surface of the circuit element layer PCL while preventing particles such as water from being permeated into the circuit element layer PCL provided with transistors P17 and P27. A connection electrode for connecting the transistors P17 and P27 with the first electrodes P12 and P22 and a portion of the light absorption layer 5, for example, a lower portion of the light absorption layer 5 may be arranged in the insulating layer IL.

The first electrode P12 is formed on the substrate P11. The first electrode P12 according to one example may be arranged on an upper surface of the insulating layer IL. The first electrode P12 may be provided transparently to transmit external light. For example, the first electrode P12 may be formed of a transparent conductive material (TCO) such as ITO and IZO, which can transmit light. That is, the first electrode 12 may be made of a transparent electrode. The first electrode P12 may include a first sub electrode provided in the first subpixel P11a, a second sub electrode provided in the second sub electrode P11b and a third sub electrode provided in the third subpixel P11c.

The first sub electrode is formed on the substrate P11, and is connected to a source electrode of the first sub thin film transistor through a contact hole passing through a portion of the circuit element layer PCL and the insulating layer IL.

The second sub electrode is formed on the substrate P11, and is connected to a source electrode of the second sub thin film transistor through a contact hole passing through a portion of the circuit element layer PCL and the insulating layer IL.

The third sub electrode is formed on the substrate P11, and is connected to a source electrode of the third sub thin film transistor through a contact hole passing through a portion of the circuit element layer PCL and the insulating layer IL.

In this case, the first to third sub thin film transistors may be N-type TFTs.

If the first to third thin film transistors are provided as P-type TFTs, each of the first to third sub electrodes may be connected to a drain electrode of each of the first to third sub thin film transistors.

That is, each of the first to third sub electrodes may be connected to a source electrode or a drain electrode in accordance with types of the first to third sub thin film transistors.

The display apparatus 1 according to one embodiment of the present disclosure may further comprise a plurality of banks BK for partitioning the first subpixel P11a and P21a, the second subpixel P11b and P21b, and the third subpixel P11c and P21c from one another.

The bank BK may be provided to cover edges of the first sub electrode, the second sub electrode and the third sub electrode, thereby partitioning the first subpixel P11a and P21a, the second subpixel P11b and P21b, and the third subpixel P11c and P21c from one another. The bank BK serves to define the subpixels, that is, a light emitting portion. Also, since an area where the bank BK is formed does not emit light, the area may be defined as a non-light emitting portion. The bank BK may be formed of an organic film such as acryl resin, epoxy resin, phenolic resin, polyamide resin, and polyimide resin. The bank BK may include a first bank P13, and a second bank P23. Since the first area A1 should be provided transparently, the first bank P13 arranged in the first area A1 may be provided transparently. That is, the first bank P13 may be a transparent bank. Although the transparent bank may be provided even in the second area A2, the transparent bank may only be arranged in the first area A1 to improve transmittance of the external light EL. A black bank not the transparent bank may be provided in the second area A2. That is, the second bank P23 arranged in the second area A2 may be provided as a black bank.

The organic light emitting layer P14 is arranged on the first electrode P12. The organic light emitting layer P14 according to one example may include a hole transporting layer HTL, a light emitting layer EML, a hole blocking layer HBL, and an electron transporting layer ETL. The organic light emitting layer P14 may further include a hole injecting layer HIL, an electron blocking layer EBL, and an electron injecting layer EIL.

The hole injecting layer HIL, the hole transporting layer HTL, the electron transporting layer ETL, and the electron injecting layer EIL of the organic light emitting layer P14 are intended to improve emission efficiency of the light emitting layer EML. The hole transporting layer HTL and the electron transporting layer ETL are intended for balance of electrons and holes. The hole injecting layer HIL and the electron injecting layer EIL are intended to enhance injection of electrons and holes.

In more detail, the hole injecting layer HIL may facilitate hole injection by lowering injection energy barrier of holes injected from an anode material. The hole transporting layer HTL serves to transport holes injected from an anode to the light emitting layer without loss.

The light emitting layer EML is a layer for emitting light through recombination of holes injected from an anode and electrons injected from a cathode, and may emit light of red, blue and green colors in accordance with combination energy inside the light emitting layer and form a white light emitting layer by configuring a plurality of light emitting layers. The hole blocking layer HBL may be provided between the light emitting layer EML and the electron transporting layer ETL to block movement of holes which are not combined with electrons in the light emitting layer EML. The electron blocking layer EBL is provided between the light emitting layer EML and the hole transporting layer HTL and serves to trap electrons in the light emitting layer EML to allow the electrons not to move from the light emitting layer EML to the hole transporting layer HTL.

The electron transporting layer ETL serves to transport the electrons injected from the cathode to the light emitting layer. The electron injecting layer EIL serves to facilitate injection of the electrons from the cathode by lowering a potential barrier during injection of the electrons.

If a high potential voltage is applied to the first electrode P12 and a low potential voltage is applied to the second electrode P15, holes and electrons are moved to the organic light emitting layer P14 through the hole transporting layer and the electron transporting layer, respectively and combined with each other in the organic light emitting layer P14 to emit light.

The organic light emitting layer P14 may include a first organic light emitting layer P14a provided on the first sub electrode, a second organic light emitting layer P14b provided on the second sub electrode, and a third organic light emitting layer P14c provided on the third sub electrode. The first organic light emitting layer P14a, the second organic light emitting layer P14b and the third organic light emitting layer P14c may be provided in one pixel. In this case, one pixel may mean, but is not limited to, one pixel capable of embodying white light by combination of red light, green light and blue light.

As described above, each of the first to third organic light emitting layers P14a, P14b and P14c may include a hole injecting layer, a hole transporting layer, an electron blocking layer, a light emitting layer, a hole blocking layer, an electron transporting layer, and an electron injecting layer.

If the first organic light emitting layer P14a, the second organic light emitting layer P14b and the third organic light emitting layer P14c are provided to emit red (R) light, green (G) light and blue (B) light, an arrangement sequence of the first to third organic light emitting layers P14a, P14b and P14c for the first to third sub electrodes may be combined in various ways. As the first organic light emitting layer P14a, the second organic light emitting layer P14b and the third organic light emitting layer P14c emit red (R) light, green (G) light and blue (B) light, the display apparatus 1 according to one embodiment of the present disclosure may not use a color filter, whereby the manufacturing cost may be reduced as compared with the case that a color filter is used. Also, as the display apparatus 1 according to one embodiment of the present disclosure does not use a color filter, transmittance of the external light EL for the auxiliary member 4 may be improved.

The second electrode P15 is arranged on the organic light emitting layer P14. The second electrode P15 according to one example is a common layer commonly formed in the first subpixel P11a, the second subpixel P11b and the third subpixel P11c. The second electrode P15 may be formed of a transparent conductive material (TCO) such as ITO and IZO, which can transmit light.

Referring to FIG. 2B again, the encapsulation layer P16 may be formed on the second electrode P15. The encapsulation layer P16 serves to prevent oxygen or water from being permeated into the organic light emitting layer P14 and the second electrode P15. To this end, the encapsulation layer P16 may include at least one inorganic film and at least one organic film.

For example, the encapsulation layer P16 may include a first inorganic film, an organic film, and a second inorganic film. In this case, the first inorganic film is formed to cover the second electrode P15. The organic film is formed to cover the first inorganic film. It is preferable that the organic film is formed at a thickness thick enough to prevent particles from being permeated into the organic light emitting layer P14 and the second electrode P15 by passing through the first inorganic film. The second inorganic film is formed to cover the organic film.

Meanwhile, as shown in FIG. 2A, the display apparatus 1 according to one embodiment of the present disclosure may further comprise a cover glass 6.

The cover glass 6 is intended to protect the encapsulation layer P16, the second electrode P15, the organic light emitting layer P14, the first electrode P12 and the substrate P11 so as not to be damaged from particles such as water and dust and external impact. The cover glass 6 may be arranged on the encapsulation layer P16. The cover glass 6 may be arranged even in the second area A2.

Consequently, in the display apparatus 1 according to one embodiment of the present disclosure, the first area A1 may be provided transparently to improve transmittance of the external light EL for the auxiliary member 4. In more detail, the substrate P11, the first electrode P12, the first bank P13 and the second electrode P15, which are arranged in the first area A1, may be provided transparently. The encapsulation layer P16 and the first thin film transistor P17, which are arranged in the first area A1, may be provided transparently. However, if the first thin film transistor P17 may be arranged in the second area A2 rather than in the first area A1, the first thin film transistor P17 may not be provided transparently.

The second pixel P2 includes a substrate P21, a first electrode P22, a second bank P23, an organic light emitting layer P24, a second electrode P25, an encapsulation layer P26, and a second thin film transistor P27. Since the second pixel P2 is based on single-sided emission, elements of the second pixel P2 are the same as the substrate P11, the first electrode P12, the first bank P13, the organic light emitting layer P14, the second electrode P15, the encapsulation layer P16, and the first thin film transistor P17 of the first pixel P1 except that some elements of the second pixel P2 are provided opaquely. Therefore, the elements provided opaquely will be described hereinafter.

First of all, referring to FIG. 2C, unlike the first area A1 overlapped with the auxiliary member 4, the second area A2 is based on a single sided emission (or top emission) and may be provided opaquely to enhanced luminance of image light for a user. Therefore, in the second pixel P2, the elements arranged below the organic light emitting layer P24 may be made of a reflective material or provided opaquely such that light emitted from the organic light emitting layer P24 may be emitted to a user. For example, the first electrode P22 of the second pixel P2 may be provided as a reflective electrode, and the substrate P21, the circuit element layer PCL, the insulating layer IL, the second bank P23 and the second thin film transistor P27 may be provided opaquely.

However, the elements arranged above the organic light emitting layer P24, for example, the second electrode P25 and the encapsulation layer P26 of the second pixel P2 may be provided transparently to improve transmittance of light emitted from the organic light emitting layer P24 to the upper portion in the same manner as the second electrode P15 and the encapsulation layer P16 of the first pixel P1.

Meanwhile, the first organic light emitting layer P24a, the second organic light emitting layer P24b and the third organic light emitting layer P24c of the second pixel P2 may be provided to emit red light, green light and blue light in the same manner as the first organic light emitting layer P14a, the second organic light emitting layer P14b and the third organic light emitting layer P14c of the first pixel P1.

In the display apparatus 1 according to one embodiment of the present disclosure, since the first area A1 should be provided transparently and the second area A2 should be provided opaquely, a difference in process between the elements arranged in the first area A1 and the elements arranged in the second area A2 may occur.

For example, since the substrate P11 arranged in the first area A1 should be provided transparently and the substrate P21 arranged in the second area A2 should be provided opaquely, after a transparent substrate is entirely arranged in the first area A1 and the second area A2, an opaque material may further be formed on only the substrate in the second area A2, whereby the substrate P11 arranged in the first area A1 may be provided transparently and the substrate P21 arranged in the second area A2 may be provided opaquely.

For another example, a transparent material may be deposited on the first area A1 to form the transparent substrate P11, and an opaque material may be deposited on the second area A2 to form the opaque substrate P21.

Similarly to the above process, the first electrode P12 and the first bank P13 arranged in the first area A1 may be provided transparently, and the first electrode P22 and the second bank P23 arranged in the second area A2 may be provided opaquely. For example, the first bank P13 arranged in the first area A1 may be a transparent bank, and the second bank P23 arranged in the second area A2 may be a black bank. However, without limitation to this example, the transparent bank may be arranged in both the first area A1 and the second area A2. The black bank may be made of a black material that absorbs light. However, since the black bank covers edges of the first electrode P22, if its dielectric constant is high, short-circuit with the second electrode P25 may occur. Therefore, the black bank may be made of a black material having a low dielectric constant. Since the black bank reduces transmittance of the external light EL for the auxiliary member 4, the black bank cannot be arranged in the first area A1.

Since the second electrode P15 arranged in the first area A1 and the second electrode P25 arranged in the second area A2 should be provided transparently, the second electrode P15 and the second electrode P25 may be provided in the first area A1 and the second area A2 transparently by one process.

Although FIGS. 2A to 2C show that one pixel is only arranged in each of the first area A1 and the second area A2, a plurality of pixels may be arranged in each of the first area A1 and the second area A2.

Referring to FIG. 1 again, the main body 3 is intended to support the display panel 2. The main body 3 forms an overall external appearance of the display apparatus 1 according to one embodiment of the present disclosure, and may be made of, but not limited to, a hollow cuboid shape. The display panel 2 may be coupled to the main body 3 and supported by the main body 3. The display panel 2 may be coupled to the main body 3 through an adhesive member such as resin and double-sided tape.

The main body 3 may include a storage groove H (shown in FIG. 2A). The storage groove H is intended to store a printed circuit board for driving the display panel 2, a driving gear such as a battery, and the auxiliary member 4. The storage groove H may be provided by, but not limited to, the display panel 2 and the main body 3. The storage groove H may be provided by only the main body 3 if it may store the driving gear and the auxiliary member 4. The main body 3 may be formed of a metal material for rigidity, but may be formed of a plastic material for weight lightening.

The main body 3 may be provided to surround the display panel 2, and therefore may prevent the display panel 2 from being damaged from external impact. Therefore, the main body 3, as shown in FIG. 1, may be arranged at the outmost of the display apparatus 1 according to one embodiment of the present disclosure.

The auxiliary member 4 includes devices arranged inside the main body 3, for example, a camera, a proximity sensor, an illumination sensor, and a speaker. Since the display apparatus 1 according to one embodiment of the present disclosure is embodied as a full screen display, the auxiliary member 4 may be arranged in the storage groove H formed inside the main body 3 such that the auxiliary member 4 may not be externally protruded. Hereinafter, a description will be given based on that the auxiliary member 4 is a camera, for example.

Since the auxiliary member 4 is arranged inside the main body 3 or below the display panel 3, the first area A1 may be provided transparently such that the external light may enter the auxiliary member 4. The first area A1 may be formed at, but not limited to, the same size as that of the auxiliary member 4. The first area A1 may be provided to be greater than the auxiliary member 4 to allow the external light to enter the auxiliary member 4 well. On the other hand, if the first area A1 is provided to be smaller than the auxiliary member 4, the amount of the external light entering the auxiliary member 4 may be reduced to reduce the amount of the external light sensed by the auxiliary member 4, whereby a problem may occur in that a camera image becomes blur. However, if the width W1 (shown in FIG. 3) of the auxiliary member 4 is too wider than the width W2 of the first area A1, the external light EL reflected in the auxiliary member 4 may be re-reflected in a metal material such as a line without being absorbed in the light absorption portion 5 and then may enter the auxiliary member 4, whereby the width W2 of the first area A1 may be equal to the width W1 of the auxiliary member 4 or may be controlled within the range that the external light EL reflected in the auxiliary member 4 is absorbed in the light absorption portion 5.

Meanwhile, the auxiliary member 4 may be arranged to be spaced apart from the substrate P11 arranged in the first area A1 toward the inside of the main body 3 at a predetermined distance. If the auxiliary member 4 is in contact with a lower surface of the substrate P11, the auxiliary member 4 or the substrate P11 may be damaged when external impact occurs. Therefore, as shown in FIG. 2A, the auxiliary member 4 may be arranged to be spaced apart from the substrate P11 toward a lower portion at a predetermined distance. A spaced distance G (shown in FIG. 4) between the auxiliary member 4 and the substrate P11 may be calculated by a radius of a camera lens, a moving distance of the external light EL reflected on a surface or the inside of the camera lens to the light absorption portion 5, and a thickness of the camera lens.

For example, as shown in FIG. 4, an angle θ between a base surface of the camera lens and the reflected external light EL may be calculated using a radius R of the camera lens and a moving distance ML of the external light EL reflected on the surface or the inside of the camera lens to the light absorption portion 5, and a distance D from the base surface of the camera lens to a lower surface of the light absorption portion 5 may be calculated from the angle θ. Then, a thickness of the circuit element layer PCL, a thickness of the display panel 2, and a thickness T of the camera lens may be subtracted from the distance D, whereby the spaced distance G between the auxiliary member 4 and the substrate P11 may be calculated.

The display apparatus 1 according to one embodiment of the present disclosure may further comprise a support member 7 and an insertion member 8.

The support member 7 is intended to support the auxiliary member 4. The support member 7 according to one example may be coupled to a lower surface of the auxiliary member 4 in the main body 3. The support member 7 may be coupled to the main body 3 to support the auxiliary member 4. The support member 7 may be made of a lightweight material such as plastic for weight lightening, but may not be limited to this example. The support member 7 may be made of a metal material if it can support the auxiliary member 4. The support member 7 may be provided to be greater than the auxiliary member 4 to support the display panel 2 arranged in the second area A2 and the circuit element layer PCL, the insulating layer IL, the first electrode P22, the second bank P23, the organic light emitting layer P24, the second electrode P25, the encapsulation layer P26 and the cover glass 6, which are arranged on the display panel 2. The insertion member 8 may be arranged between the display panel 2 and the support member 7 arranged in the second area A2.

The insertion member 8 is intended to make sure of a space for arranging the auxiliary member 4. The insertion member 8 may be coupled to the main body 3 but is not limited to this example. The insertion member 8 may be arranged between the display panel 2 and the support member 7 in the second area A2. The insertion member 8 may be arranged in only the second area A2 to prevent an absorption rate of the external light EL for the auxiliary member 4 from being reduced.

As the insertion member 8 according to one example is provided to be thicker than the auxiliary member 4, the auxiliary member 4 arranged in the first area A1 may be spaced apart from the display panel 2 arranged in the first area A1 at a predetermined distance. If the auxiliary member 4 is arranged to be in contact with or close to the lower surface of the display panel 2 arranged in the first area A1, the auxiliary member 4 may collide with the display panel 2 arranged in the first area A1 even due to small external impact, whereby at least one of the auxiliary member 4 and the display panel 2 arranged in the first area A1 may be damaged. Therefore, the insertion member 8 may be provided to be thicker than the auxiliary member 4 such that the auxiliary member 4 may be spaced apart from the display panel 2 arranged in the first area A1 at a distance for avoiding collision even in case of external impact.

The insertion member 8 may be made of a material such as plastic, resin, metal material and damping material. For example, if the insertion member 8 is made of resin, a coupling force between the display panel 2 arranged in the second area A2 and the support member 7 may be increased. For another example, if the insertion member 8 is made of a damping material, the insertion member 8 may absorb external impact, whereby the auxiliary member 4 may effectively be prevented from colliding with the display panel 2 arranged in the first area A1. For another example, if the insertion member 8 is made of a metal material, heat emitted from the display panel 2 may be transferred to the support member 7 or the main body 3, whereby the insertion member 8 may serve as a radiator panel for transferring heat emitted from the display panel 2 to the outside. However, in this case, a light absorption material (or light absorption structure) for preventing external light (EL) reflection from occurring may be provided at a side adjacent to the auxiliary member 4.

Referring to FIG. 2A again, the light absorption portion 5 is intended to absorb light. The light absorption portion 5 according to one example is intended to absorb the external light EL reflected from the surface and the inside of the auxiliary member 4 such as a camera. The light absorption portion 5 may be made of a material that absorbs light, and therefore may absorb the external light EL reflected in the auxiliary member 4. For example, the light absorption portion 5 may be made of a black material. Any material may be used as the black material if it is a black, but the black material having a high dielectric constant may generate electric short circuit between the first electrode P12 and the second electrode P15. Therefore, the light absorption portion 5 may be made of one of black resin, graphite powder, gravure ink, black spray and black enamel, which are photosensitive organic insulating materials of a low dielectric constant. For another example, the light absorption portion 5 may be provided to include a light absorption material such as carbon.

The light absorption portion 5 may be made of a black resin as shown in FIG. 2A, but is not limited to this example. Since the light absorption portion 5 has only to absorb the external light EL reflected in the auxiliary member 4, only sides of the light absorption portion 5 adjacent to the first area A1 may be made of black resin.

The light absorption portion 5 may be arranged in the second area A2. In the display apparatus 1 according to one embodiment of the present disclosure, since the first area A1 arranged to overlap the auxiliary member 4 is provided transparently, the amount of the external light EL entering the auxiliary member 4 may be increased, whereby exactness of the external light EL sensed by the auxiliary member 4 may be improved. Therefore, if the light absorption portion 5 is overlapped with the first area A1, the light absorption portion 5 interferes with the external light EL entering the auxiliary member 4, whereby the light absorption portion 5 may be arranged in only the second area A2.

Figure 5:
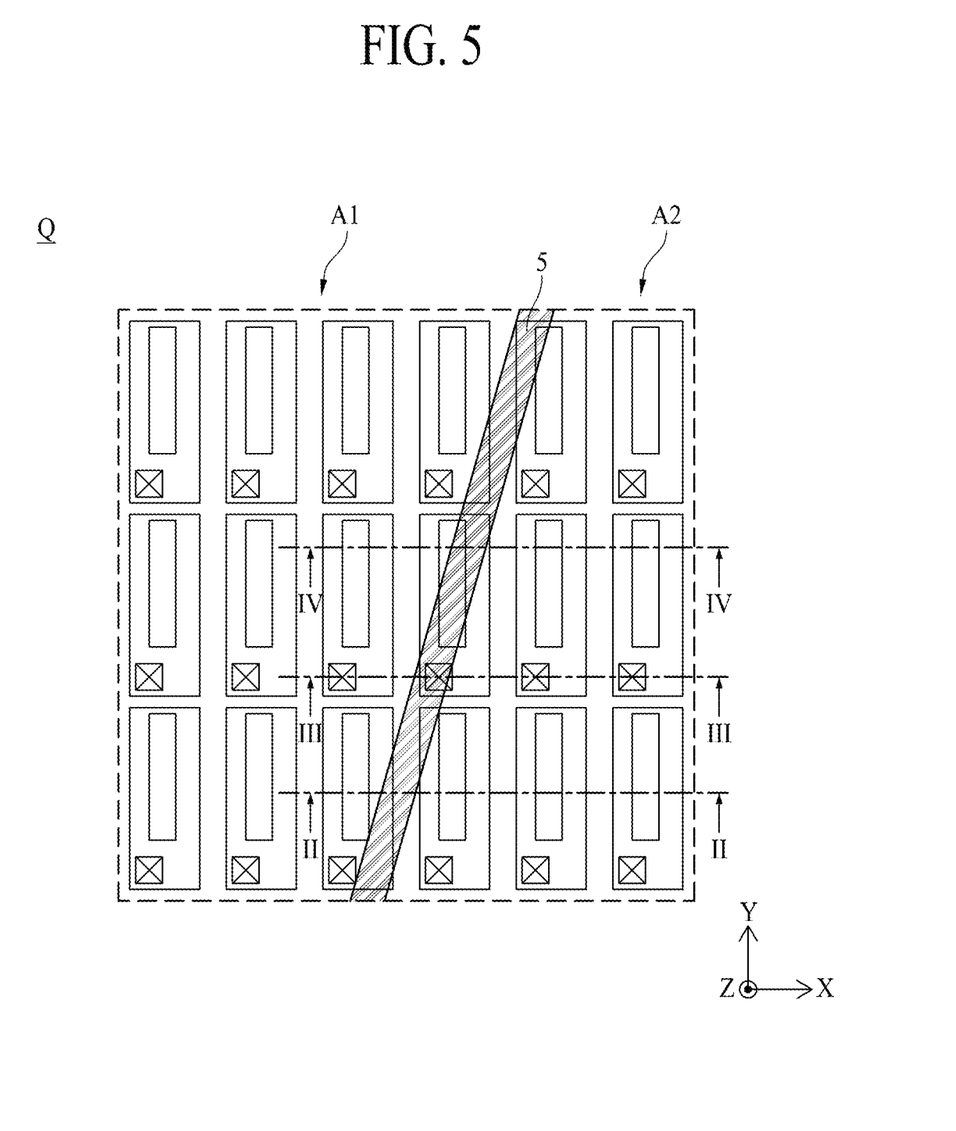
FIG. 5 is a brief enlarged view illustrating a portion Q of FIG. 1.
Figure 6A:
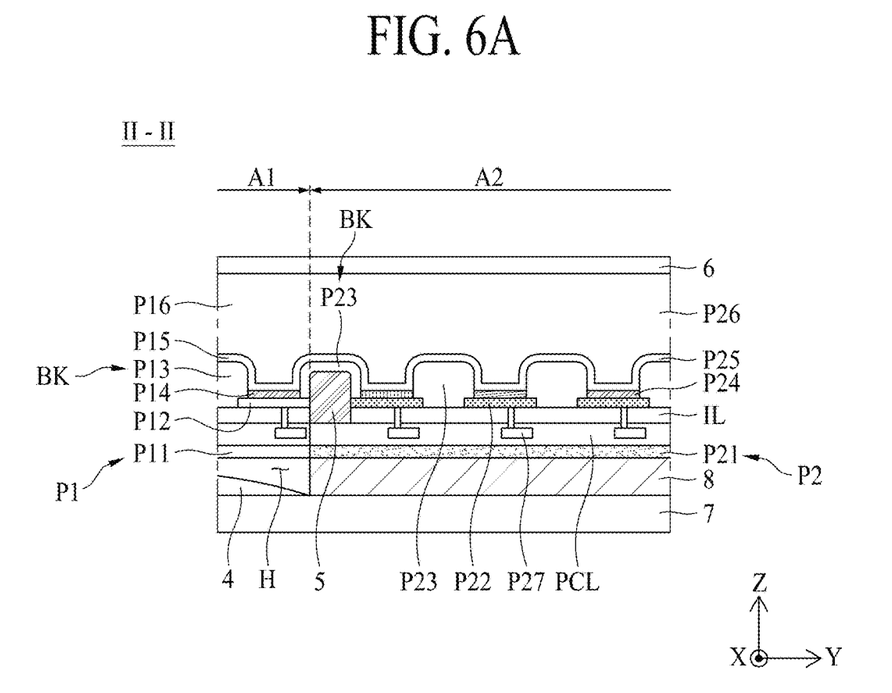
FIG. 6A is a brief cross-sectional view taken along line II-II shown in FIG. 5.
Figure 6B:
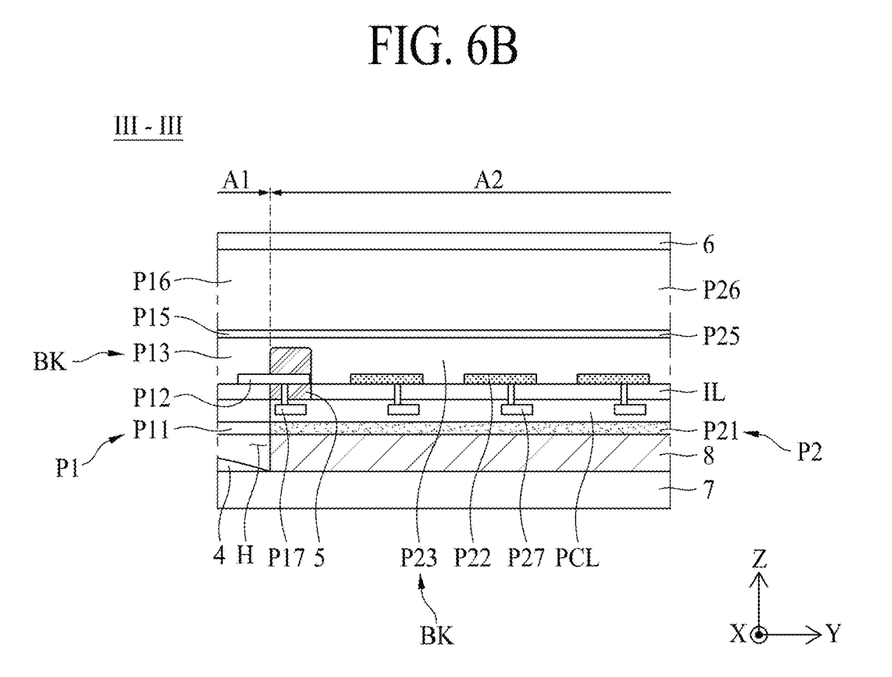
FIG. 6B is a brief cross-sectional view taken along line III-III shown in FIG. 5.
Figure 6C:
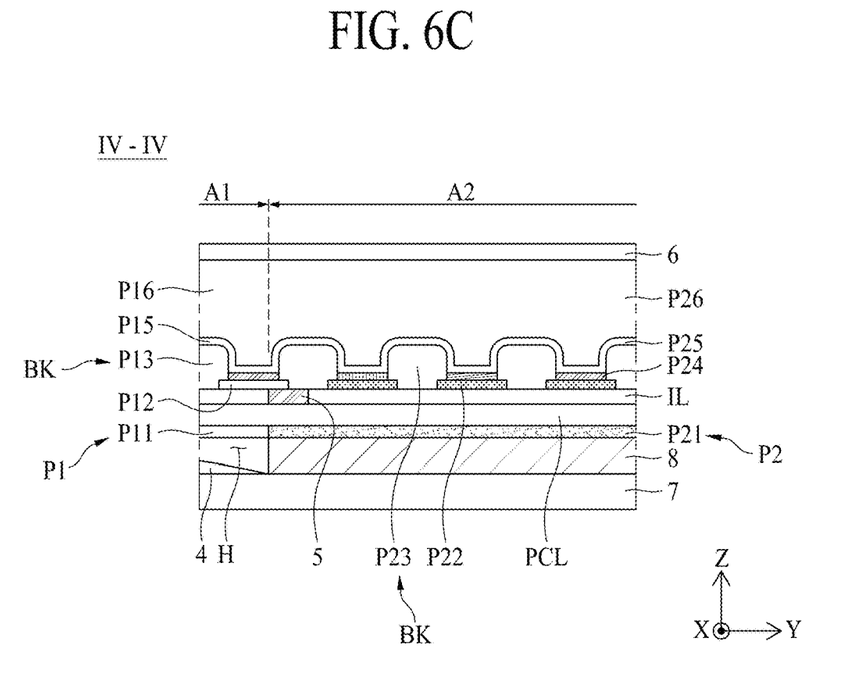
FIG. 6C is a brief cross-sectional view taken along line IV-IV shown in FIG. 5.
Figure 7:
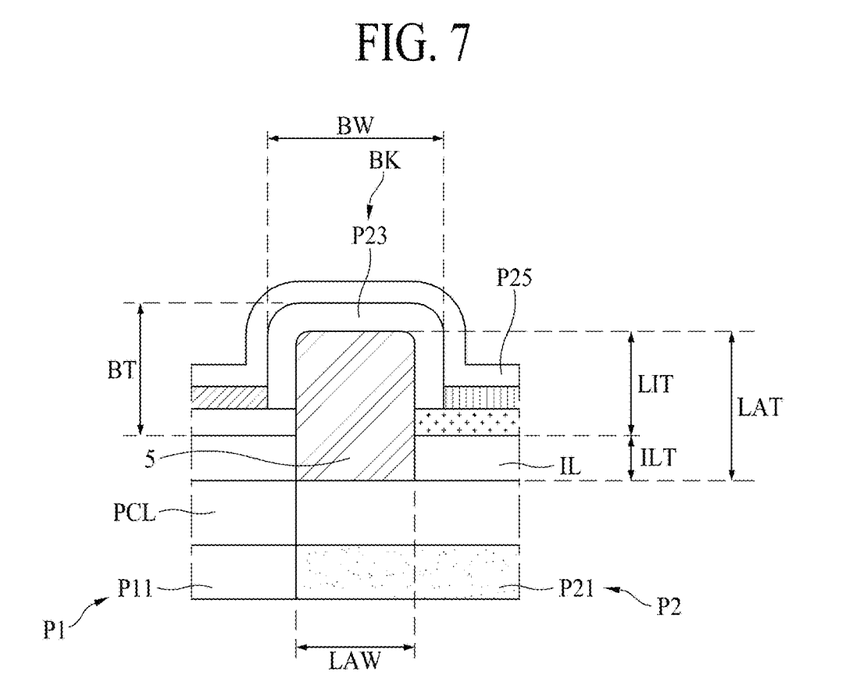
FIG. 7 is a brief view illustrating a portion of FIG. 6A.

FIG. 5 is a brief enlarged view illustrating a portion Q of FIG. 1, FIG. 6A is a brief cross-sectional view taken along line II-II shown in FIG. 5, FIG. 6B is a brief cross-sectional view taken along line III-III shown in FIG. 5, FIG. 6C is a brief cross-sectional view taken along line IV-IV shown in FIG. 5, and FIG. 7 is a brief view illustrating a portion of FIG. 6A.

FIG. 5 is a brief enlarged view illustrating a portion of each of the first area A1, the second area A2 and the light absorption portion 5 arranged in the second area A2 to surround the first area A1 in the display apparatus 1 according to one embodiment of the present disclosure.

In FIG. 6A which is a brief cross-sectional view taken along line II-II shown in FIG. 5, the light absorption portion 5 is arranged at a boundary area between subpixels. That is, the light absorption portion 5 is arranged to overlap the bank. As shown in FIG. 6A, the light absorption portion 5 may be arranged to overlap the second bank P23 arranged in the second area A2. As described above, if the light absorption portion 5 is arranged to overlap the first area A1, since the light absorption portion 5 may cover the external light EL headed for the auxiliary member 4, the light absorption portion 5 may be arranged in only the second area A2.

Referring to FIG. 7, a width LAW of the light absorption portion 5 may be provided to be equal to or smaller than a width BW of the second bank P23. If the width LAW of the light absorption portion 5 is greater than the width BW of the second bank P23, since the light absorption portion 5 is partially overlapped with the first area A1, an absorption rate of the external light EL of the auxiliary member 4 may be reduced. Therefore, in the display apparatus 1 according to one embodiment of the present disclosure, the width LAW of the light absorption portion 5 is equal to or narrower than the width BW of the second bank P23, whereby the light absorption portion 5 may well absorb the external light EL reflected in the auxiliary member 4 without reducing the absorption rate of the external light EL of the auxiliary member 4.

Meanwhile, as shown in FIG. 7, the light absorption portion 5 may partially be inserted into the second bank P23 transparently provided in the second area A2. This is to allow the light absorption portion 5 to cover the first area A1 within a wider range if possible. If the light absorption portion 5 surrounding the first area A1 is thick, an area that may absorb the external light EL reflected in the auxiliary member 4 becomes wide, whereby the absorption rate of the external light EL of the light absorption portion 5 may be improved. In this case, the thickness LAT of the light absorption portion 5 may be provided to be thicker than a thickness ILT of the insulating layer IL. In more detail, the thickness LAT of the light absorption portion 5 may be a thickness obtained by adding the thickness ILT of the insulating layer IL to a thickness LIT of the light absorption portion 5 inserted into the second bank P23. The thickness LIT of the light absorption portion 5 inserted into the second bank P23 may be provided to be equal to or smaller than the thickness BT of the second bank P23. If the thickness LIT of the light absorption portion 5 inserted into the second bank P23 is thicker than the thickness BT of the second bank P23, a step difference occurs between the light absorption portion 5 and the second bank P23, whereby the second electrode P25 may be disconnected. Therefore, in the display apparatus 1 according to one embodiment of the present disclosure, the thickness LIT of the light absorption portion 5 inserted into the second bank P23 may be equal to or smaller than the thickness BT of the second bank P23, whereby disconnection of the second electrode P25 may be avoided and the external light EL reflected in the auxiliary member 4 may be absorbed by the light absorption portion 5.

In FIG. 6B which is a brief cross-sectional view taken along line shown in FIG. 5, the light absorption portion 5 is arranged in a contact portion where the first electrode P12 is in contact with the transistor P17. Therefore, as shown in FIG. 6B, the organic light emitting layers P14 and P24 are not arranged on the first electrodes P12 and P22, and the first and second banks P13 and P23 may be provided to cover the first electrodes P12 and P22. In this case, the first bank P13 and the second bank P23 may be provided to be connected with each other. The light absorption portion 5 may be arranged to overlap the second bank P23 arranged in the second area A2. If the light absorption portion 5 is arranged to overlap the first area A1, since the light absorption portion 5 may cover the external light EL headed for the auxiliary member 4, the light absorption portion 5 may be arranged in only the second area A2. In the same manner as FIG. 6A, the light absorption portion 5 may partially be inserted into the transparent bank P23 arranged in the second area A2 to improve the absorption rate of the external light EL reflected in the auxiliary member 4 by covering the first area A1 within a wider range if possible. Therefore, the thickness LAT of the light absorption portion 5 may be provided as a thickness obtained by adding the thickness ILT of the insulating layer to the thickness LIT of the light absorption portion 5 inserted into the second bank P23. The thickness LIT of the light absorption portion 5 inserted into the second bank P23 may be provided to be equal to or smaller than the thickness BT of the second bank P23 to avoid disconnection of the second electrode P25.

In FIG. 6C which is a brief cross-sectional view taken along line IV-IV shown in FIG. 5, the light absorption portion 5 is partially arranged to overlap the subpixel. Therefore, as shown in FIG. 6C, the light absorption portion 5 may partially be overlapped with the second bank P23 which is a transparent bank. However, even in this case, the light absorption portion 5 may be arranged in the second area A2 so as not to interfere with the external light EL headed for the auxiliary member 4.

Referring to FIG. 6C again, since the light absorption portion 5 is arranged below the first electrode P12, the light absorption portion 5 may not be inserted into the second bank P23. This is because that the first electrode P12 is formed and then the second bank P23 is formed after the circuit element layer PCL is patterned and the light absorption portion 5 is formed in the patterned portion. Therefore, the light absorption portion 5, as shown in FIG. 6C, may be arranged in only the insulating layer IL to absorb the external light EL reflected in the auxiliary member 4. In this case, the thickness of the light absorption portion 5 may be equal to the thickness of the insulating layer IL. The width of the light absorption portion 5 may be provided to be equal to or narrower than the width of the second bank P23 as described above.

Figure 8A:
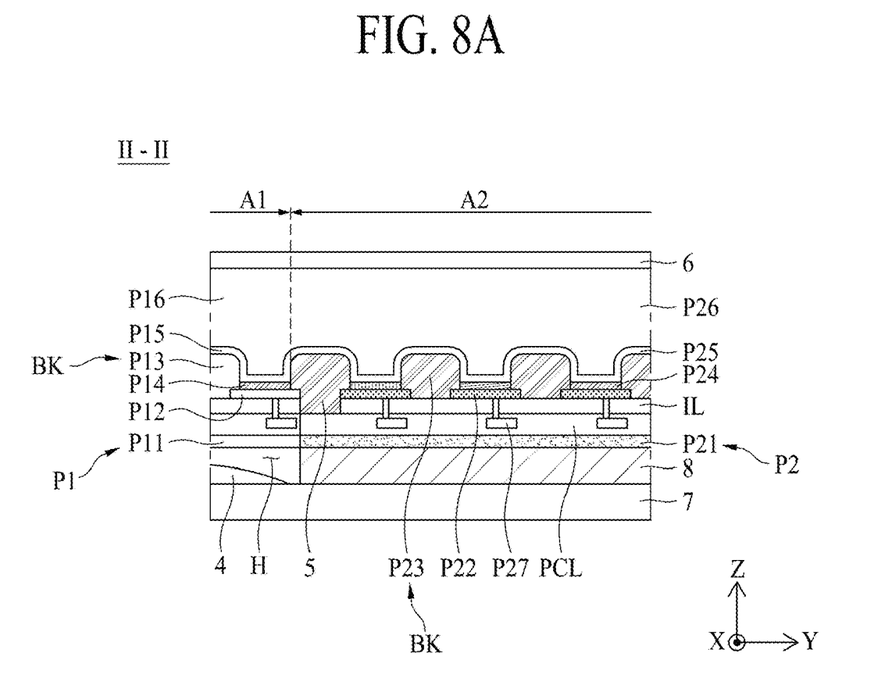
FIG. 8A is a brief cross-sectional view illustrating another example of FIG. 6A.
Figure 8B:
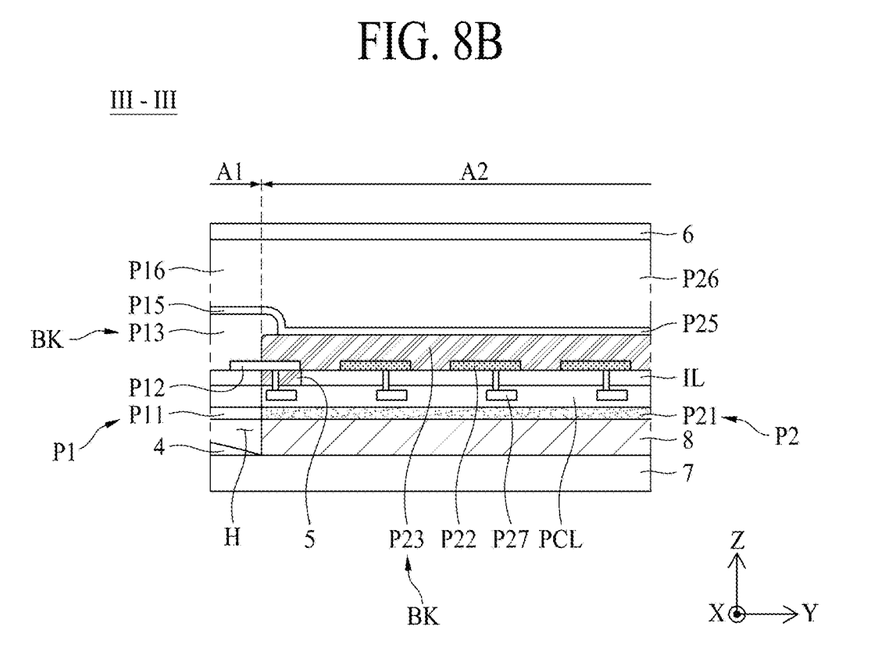
FIG. 8B is a brief cross-sectional view illustrating still another example of FIG. 6B.
Figure 8C:
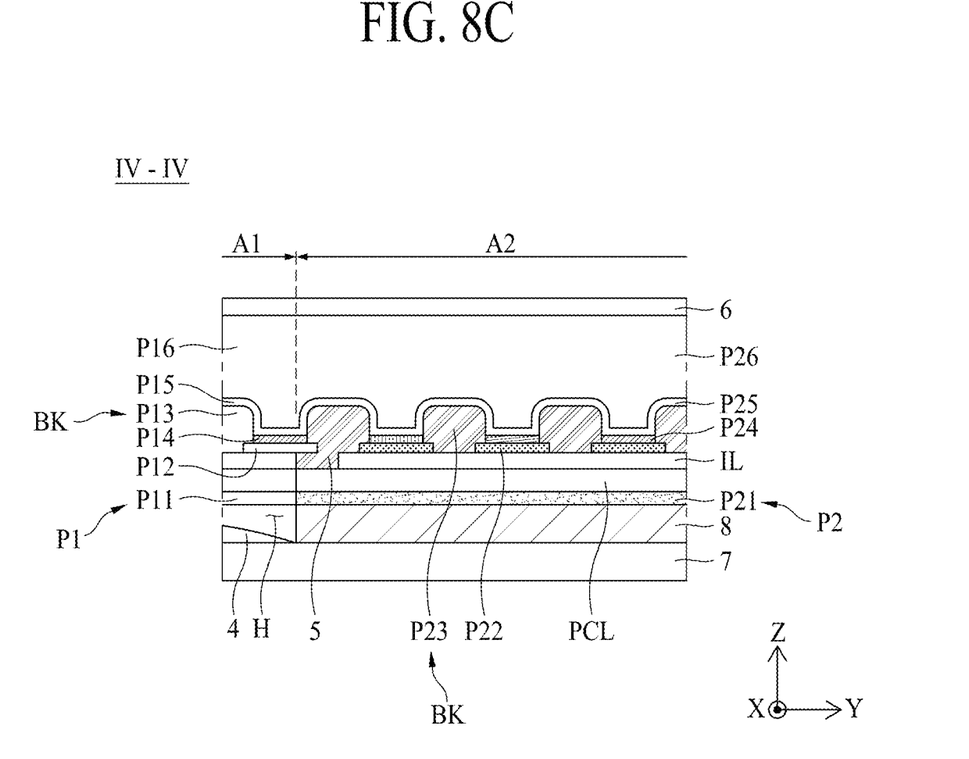
FIG. 8C is a brief cross-sectional view illustrating another example of FIG. 6C.

FIG. 8A is a brief cross-sectional view illustrating another example of FIG. 6A, FIG. 8B is a brief cross-sectional view illustrating still another example of FIG. 6B, and FIG. 8C is a brief cross-sectional view illustrating another example of FIG. 6C.

The display apparatus of FIGS. 8A to 8C is the same as the display apparatus of FIGS. 6A to 6C except that the second bank P23 arranged in the second area A2 is provided as a black bank. However, even in this case, the second bank P23 and the light absorption portion 5 may be arranged so as not to overlap the first area A1 to improve the absorption rate of the external light EL of the auxiliary member 4. Therefore, the same reference numbers will be given to the same elements as those of FIGS. 6A to 6C throughout the drawings. Hereinafter, the different elements from those of FIGS. 6A to 6C will be described.

In case of the display apparatus based on FIGS. 6A to 6C, as the first bank P13 and the second bank P23 are provided as transparent banks, the first area A1 and the second area A2 may be partitioned so as not to form the bank, whereby manufacturing process may be simplified. Particularly, as shown in FIG. 6B, the first bank P13 and the second bank P23, which are arranged in a contact portion where the first electrode P12 is in contact with the transistor P17, may simultaneously be formed by one process. Therefore, an upper surface of the first bank P13 and an upper surface of the second bank P23 may be provided with flatness at the same height without step difference. Therefore, the second electrodes P15 and P25 provided on the first bank P13 and the second bank P23 may be provided with flatness.

On the other hand, in case of the display apparatus based on FIGS. 8A to 8C, the second bank P23 arranged in the second area A2 may be provided as a black bank.

First of all, in case of FIG. 8A, since the second bank P23 above the light absorption portion 5 is provided as a black bank, the second bank P23 may be arranged so as not to overlap the first area A1, whereby the second bank P23 may not interfere with absorption of the external light EL of the auxiliary member 4. Meanwhile, the light absorption portion 5 may be overlapped with the second bank P23 which is a black bank. The light absorption portion of FIG. 8A may be provided so as not to be inserted into the second bank P23 unlike FIG. 6A. This is because that the second bank P23 is provided as a black bank and therefore an area for absorbing the external light EL reflected in the auxiliary member 4 is sufficiently wide even though the light absorption portion 5 is not inserted into the black bank. However, in this case, if the light absorption portion 5 is spaced apart from the second bank P23, since the external light EL reflected in the auxiliary member 4 may be re-reflected in a metal material between the light absorption portion 5 and the second bank P23, the light absorption portion 5 may be provided to be connected with the second bank P23. After the insulating layer IL is patterned and then the light absorption portion 5 is formed in the patterned portion, the first electrodes P12 and P22 may be formed to be patterned for each subpixel and then the second bank P23 may be formed to cover edges of the first electrode P12 and P22 and to be connected to the light absorption portion 5. If the first electrodes P12 and P22 are patterned for each subpixel, the upper surface of the light absorption portion 5 is exposed, whereby the entire upper surface of the light absorption portion 5 may be connected with the second bank P23 when the second bank P23 is formed.

Next, in case of FIG. 8B, after the first electrodes P12 and P22 are patterned for each subpixel and then the second bank P23 which is a black bank is formed in the second area A2, the first bank P13 which is a transparent bank is formed in the first area A1, whereby the first bank P13 may be provided to be thicker than the second bank P23. Therefore, as shown in FIG. 8B, a step difference of different heights may be formed between the upper surface of the first bank P13 and the upper surface of the second bank P23 in a portion where the first bank P13 and the second bank P23 are adjacent to each other. Therefore, the step difference may be formed even between the second electrodes P15 and P25 provided on the first bank P13 and the second bank P23.

Next, in case of FIG. 8C, a portion of the light absorption portion 5 may be overlapped with the second bank P23. The other portion of the light absorption portion 5 may be overlapped with the subpixel arranged in the first area A1. In this case, since the light absorption portion 5 is arranged at a left side of the second bank P23 based on FIG. 8C, the first area A1 may be arranged to adjoin the light absorption portion 5. Therefore, in this case, the second bank P23 may be arranged to be spaced apart from the first area A1 at a predetermined distance. After the light absorption portion 5 and the first electrodes P12 and P22 are sequentially formed, the second bank which is a black bank is formed to cover the edges of the first electrodes P1 and P22, whereby the second bank P23 may be connected with the light absorption portion 5. If the first electrodes P12 and P22 are patterned for each subpixel, the upper surface of the light absorption portion 5 is partially exposed, whereby the upper surface of the light absorption portion 5 may partially be connected with the second bank P23 when the second bank P23 is formed. Even in case of FIG. 8C, since the second bank P23 which is a black bank is arranged above the light absorption portion 5, the light absorption portion 5 may not be inserted into the black bank. This is because that only the light absorption portion 5 absorbs the external light EL reflected in the auxiliary member 4 in FIG. 6C, but the black bank and the light absorption portion 5 absorb the external light reflected in the auxiliary member 4 in FIG. 8C. That is, it is because that the area for absorbing the external light reflected in the auxiliary member 4 in FIG. 8C is wider than that of FIG. 6C.

Consequently, in the display apparatus 1 according to one embodiment of the present disclosure, as the light absorption portion 5 is provided to surround the first area A1 of the display panel 2, the external light EL reflected from the auxiliary member 4 may be prevented from being re-reflected in a metal material such as a line and entering the auxiliary member 4, whereby image overlap or noise may be prevented from occurring.

Also, as the light absorption portion 5 is provided in the second area A2 so as not to overlap the first area A1, the absorption rate of the external light EL of the auxiliary member 4 may be increased, whereby exactness of the auxiliary member 4 for the external light EL may be improved.

Although the light absorption portion 5 is arranged on the circuit element layer PCL provided with flatness in the present disclosure, without limitation to this example, the light absorption portion 5 may be provided such that the circuit element layer PCL is patterned to be recessed within the range that the transistors P17 and P27 are not damaged, whereby a portion (or a lower portion of the light absorption portion 5) of the light absorption portion 5 may be arranged inside the circuit element layer PCL.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the patents, patent application publications, patent applications, and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:
1. A display apparatus, comprising:
a display panel having a first area and a second area surrounding the first area;
a main body supporting the display panel;
an auxiliary member arranged in the main body and overlapped with the first area of the display panel; and
a light absorption portion arranged in the second area of the display panel,
wherein both the first area and the second area of the display panel are configured to emit light,
wherein the first area includes a first pixel, the second area includes a second pixel, wherein each of the first pixel and the second pixel respectively includes a substrate, a circuit element layer provided on the substrate, a first electrode provided on the circuit element layer, and a bank provided to cover edges of the first electrode, wherein the substrate of the second pixel is on the lower surface of the circuit element layer, wherein a lower surface of the light absorption portion is disposed closer to the substrate of the second pixel than a lower surface of the bank of the second pixel in a direction from the light absorption portion toward the substrate of the second pixel, wherein the light absorption portion is arranged on an upper surface of the circuit element layer of the second pixel, and wherein each of the first pixel and the second pixel includes an insulating layer arranged on the upper surface of the circuit element layer, and the light absorption portion has a thickness equal to or thicker than that of the insulating layer.

2. The display apparatus of claim 1, wherein the first area is a transparent area, and the second area is an opaque area.

3. The display apparatus of claim 2, wherein a direct external light directly entering toward the auxiliary member from outside through the first area reaches the auxiliary member, and a re-reflective external light re-reflected from inside of the main body is absorbed by the light absorption portion.

4. The display apparatus of claim 1, wherein the bank is provided as a transparent bank or a black bank.

5. The display apparatus of claim 4, wherein the light absorption portion has a width equal to or narrower than that of a bank.

6. The display apparatus of claim 4, wherein if the light absorption portion is overlapped with the transparent bank, the light absorption portion is partially inserted into the transparent bank.

7. The display apparatus of claim 6, wherein the portion of the light absorption portion inserted into the transparent bank has a thickness equal to or smaller than that of the transparent bank.

8. The display apparatus of claim 4, wherein if the light absorption portion is partially overlapped with the transparent bank, the light absorption portion is not inserted into the transparent bank.

9. The display apparatus of claim 4, wherein each of the first pixel and the second pixel respectively further includes an organic light emitting layer arranged on the first electrode and a second electrode arranged on the organic light emitting layer and the bank, and the second electrode arranged in the first pixel and the second electrode arranged in the second pixel are provided at the same height.

10. The display apparatus of claim 4, wherein if the light absorption portion is overlapped with the black bank, the light absorption portion is connected with the black bank.

11. The display apparatus of claim 4, wherein if the light absorption portion is partially overlapped with the black bank, the light absorption portion is not inserted into the black bank.

12. The display apparatus of claim 4, wherein the first electrode of the second pixel is a reflective electrode, and the first electrode of the first pixel is a transparent electrode.

13. The display apparatus of claim 1, wherein the auxiliary member is provided as a camera or a sensor.

14. The display apparatus of claim 1, wherein the auxiliary member is arranged to be spaced apart from the substrate of the first pixel toward inside of the main body at a predetermined distance, and wherein the auxiliary member is a camera, and the predetermined distance between the auxiliary member and the substrate of the first pixel is calculated by subtracting a thickness of the circuit element layer, a thickness of the display panel, and a thickness of the camera lens from a distance between a lower surface of the camera lens and a lower surface of the light absorption portion.

15. The display apparatus of claim 2, wherein the width of the first area is equal to or greater than the width of the auxiliary member.

16. The display apparatus of claim 1, further comprising:

a support member configured to support the auxiliary member, and a width of the support member is provided to be greater than a width of the auxiliary member to support the display panel arranged in the second area; and an insertion member arranged between the display panel and the support member in the second area and is provided to be thicker than the auxiliary member to make sure of a space for arranging the auxiliary member.

17. The display apparatus of claim 1, wherein the first pixel and the second pixel are provided at different sizes.

* * * * *